US010644091B2

(12) United States Patent
Liu et al.

(10) Patent No.: US 10,644,091 B2
(45) Date of Patent: May 5, 2020

(54) ELECTRONIC DEVICE, DISPLAY PANEL AND METHOD FOR MANUFACTURING DISPLAY PANEL

(71) Applicant: SHANGHAI TIANMA AM-OLED CO., LTD., Shanghai (CN)

(72) Inventors: Xinzhao Liu, Shanghai (CN); Kaihong Huang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/051,487

(22) Filed: Aug. 1, 2018

(65) Prior Publication Data

US 2018/0337226 A1   Nov. 22, 2018

(30) Foreign Application Priority Data

May 14, 2018   (CN) .......................... 2018 1 0455044

(51) Int. Cl.
*H01L 27/32*  (2006.01)
*H01L 51/52*  (2006.01)
*H01L 51/56*  (2006.01)

(52) U.S. Cl.
CPC ...... *H01L 27/3276* (2013.01); *H01L 27/3246* (2013.01); *H01L 51/5206* (2013.01); *H01L 51/5221* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 2007/0170854 A1* | 7/2007 | Kwak | H01L 51/5246 313/512 |
| 2014/0166994 A1* | 6/2014 | Xiong | H01L 51/5246 257/40 |
| 2016/0163244 A1* | 6/2016 | Huang | G09G 3/006 324/760.02 |
| 2017/0287936 A1* | 10/2017 | Kim | H01L 27/124 |
| 2018/0182274 A1* | 6/2018 | Jung | G09G 3/20 |
| 2019/0043938 A1* | 2/2019 | Lee | H01L 27/3276 |
| 2019/0103455 A1* | 4/2019 | Song | H01L 27/3265 |

FOREIGN PATENT DOCUMENTS

CN          107275365 A       10/2017

* cited by examiner

*Primary Examiner* — Erik Kielin
(74) *Attorney, Agent, or Firm* — Kilpatrick Townsend & Stockton, LLP

(57) ABSTRACT

An electronic device, a display panel, and a method for manufacturing the display panel are provided. The display panel includes a substrate, and data fan-out lines and a power supply fan-out line arranged in a step region of the substrate. An orthographic projection of an overlapping region between the power supply fan-out line and the encapsulating region on the substrate is non-overlapping with an orthographic projection of an overlapping region between each of the data fan-out lines and the encapsulating region on the substrate, thereby reducing the encapsulating failure of the sealant due to a common overlapping region of the data fan-out lines and the power supply fan-out line in the encapsulating region, and improving the reliability of the display panel.

19 Claims, 12 Drawing Sheets

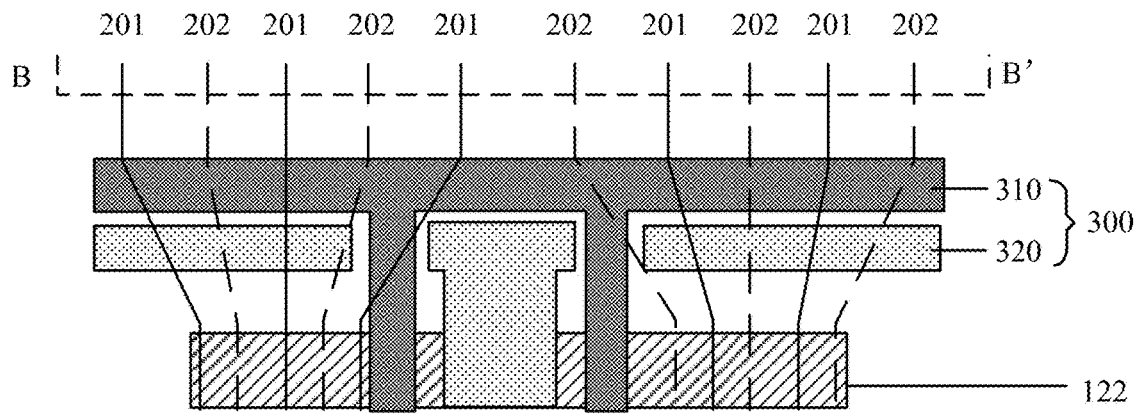
Figure 6 ( a )
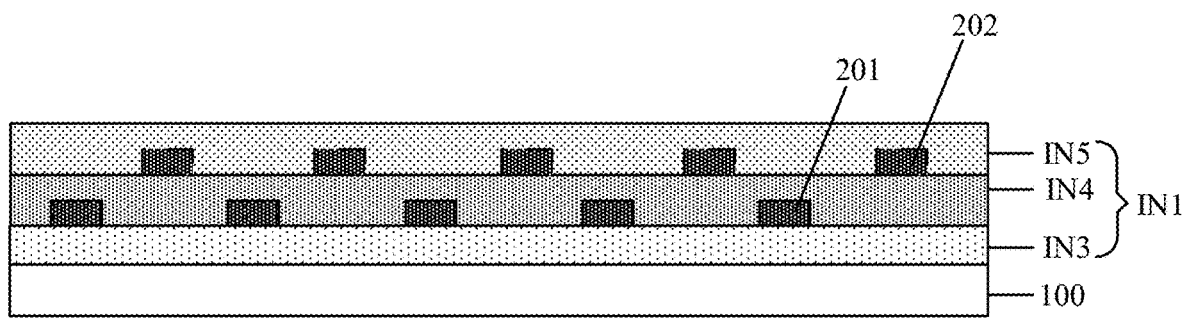
Figure 6 ( b )

ELECTRONIC DEVICE, DISPLAY PANEL AND METHOD FOR MANUFACTURING DISPLAY PANEL

CROSS REFERENCE OF RELATED APPLICATION

The present application claims priority to Chinese Patent Application No. 201810455044.1, titled "ELECTRONIC DEVICE, DISPLAY PANEL AND METHOD FOR MANUFACTURING DISPLAY PANEL", filed on May 14, 2018 with the state intellectual property office of People's Republic of China, which is incorporated herein by reference in its entirety.

FIELD

The present disclosure relates to the technical field of display, and in particular to an electronic device, a display panel, and a method for manufacturing the display panel.

BACKGROUND

With the development of display technologies, display panels have been widely used. An organic light emitting diode (OLED) display panel has advantages of a fast response speed, brilliant colors, and a light and thin structure, which gains more and more attentions in the industry.

In the conventional technology, data fan-out lines, a power supply line, and a power supply fan-out line for connecting the power supply line and a bonding region are generally arranged at a lower step of the OLED display panel. When encapsulating the power supply fan-out line, it is required to form holes to release a stress generated by a sealant provided at the power supply fan-out line during the encapsulating process. However, a common overlapping region of the data fan-out line and the power supply fan-out line fan-out line with the encapsulating region may be formed, which easily results in the encapsulating failure of the sealant and an easily broken data fan-out line, and thus reduces the reliability of the display panel.

SUMMARY

In order to solve the above technical problems, there are provided an electronic device, a display panel, and a method for manufacturing a display panel in the present disclosure, to reduce encapsulating failure of a sealant due to a common overlapping region of a data fan-out line and a power supply fan-out line with an encapsulating region, and improve reliability of the display panel.

The following technical solutions are provided according to embodiments of the present disclosure, to solve the above technical problems.

A display panel is provided, which includes a substrate. The substrate includes a display region and a step region. The step region includes: a bonding region; and an encapsulating region and a power supply line region that are sequentially arranged between the bonding region and the display region. The step region further includes: data fan-out lines connecting the display region and the bonding region; and a power supply fan-out line connecting the power supply line region and the bonding region. An orthographic projection of an overlapping region between the power supply fan-out line and the encapsulating region on the substrate is non-overlapping with an orthographic projection of an overlapping region between each of the data fan-out lines and the encapsulating region on the substrate.

An electronic device is provided, which includes at least one display panel described above.

A method for manufacturing a display panel is provided. The method includes: providing a substrate including a display region and a step region; and in the step region, providing data fan-out lines; providing a power supply line and a power supply fan-out line, where the power supply line is located in a power supply line region; providing bonding terminals in a bonding region, where the data fan-out lines connect the display region and the bonding region, and the power supply fan-out line connects the power supply line region and the bonding region; and providing a sealant in an encapsulating region, where the encapsulating region and the power supply line region are arranged between the bonding region and the display region. An orthographic projection of an overlapping region between the power supply fan-out line and the encapsulating region on the substrate is non-overlapping with an orthographic projection of an overlapping region between each of the data fan-out lines and the encapsulating region on the substrate.

BRIEF DESCRIPTION OF THE DRAWINGS

In order to more clearly illustrate embodiments of the present disclosure, the drawings to be used in the description of the embodiments are briefly described hereinafter. It is apparent that, the drawings in the following description show only some embodiments of the present disclosure.

FIG. 6a is a schematic diagram showing an arrangement of data fan-out lines according to an embodiment of the present disclosure;

FIG. 6b is a schematic sectional view taken along a line BB' in FIG. 6a;

DETAILED DESCRIPTION OF EMBODIMENTS

Embodiments of the present disclosure are described below in conjunction with drawings. It is apparent that embodiments described below are only some embodiments of the present disclosure, rather than all of the embodiments.

Figure 1:
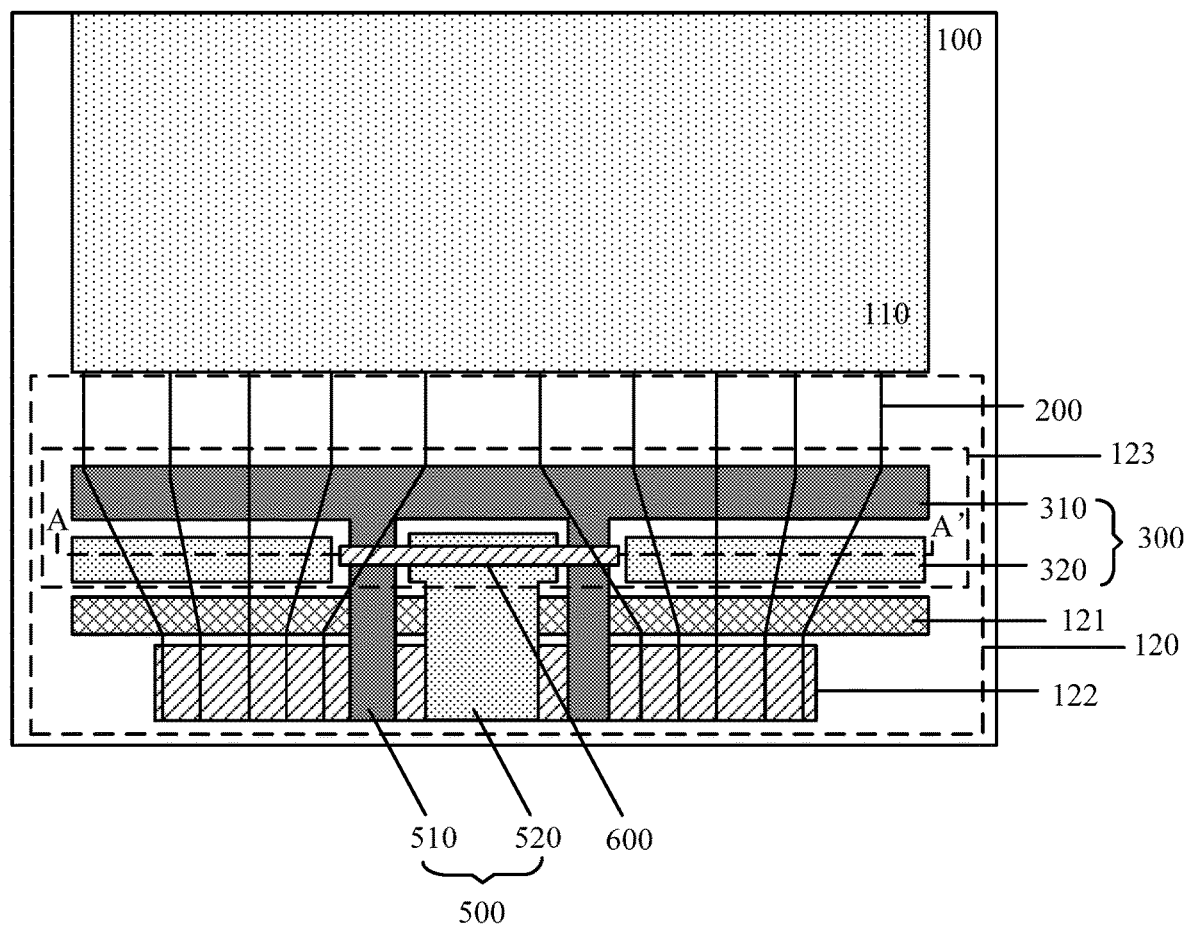
FIG. 1 is a schematic top view of a display panel according to an embodiment of the present disclosure.

A display panel is provided according to an embodiment of the present disclosure. As shown in FIG. 1, which is a schematic partial top view of the display panel, the display panel includes a substrate 100.

The substrate 100 includes a display region 110 and a step region 120. The step region 120 includes a bonding region 122, and an encapsulating region 121 and a power supply line region 123 that are sequentially arranged between the bonding region 122 and the display region 110.

The step region 120 further includes: data fan-out lines 200 for connecting the display region 110 and the bonding region 122; and a power supply fan-out line 500 for connecting the power supply line region 123 and the bonding region 122.

An orthographic projection of an overlapping region between the power supply fan-out line 500 and the encapsulating region 121 on the substrate 100 is non-overlapping with an orthographic projection of an overlapping region between each of the data fan-out lines 200 and the encapsulating region 121 on the substrate 100.

In the embodiment shown in FIG. 1, the bonding region 122 is utilized to bond a chip or a flexible printed circuit (FPC) of the display panel. In a case that a chip on flexor chip on film (COF) technology is adopted to perform bonding in the display panel, the bonding region 122 is utilized to bond the FPC. In a case that a chip on glass (COG) technology is adopted to perform bonding in the display panel, the bonding region 122 is utilized to bond the chip.

Referring to FIG. 1, since the orthographic projection of the overlapping region between the power supply fan-out line 500 and the encapsulating region 121 on the substrate 100 is non-overlapping with the orthographic projection of the overlapping region between the data fan-out line 200 and the encapsulating region 121 on the substrate 100, the problem of the encapsulating failure of the sealant and the easily broken data fan-out line due to a common overlapping region of the data fan-out line 200 and the power supply fan-out line 500 with the encapsulating region can be avoided, improving the reliability of the display panel.

Figure 2:
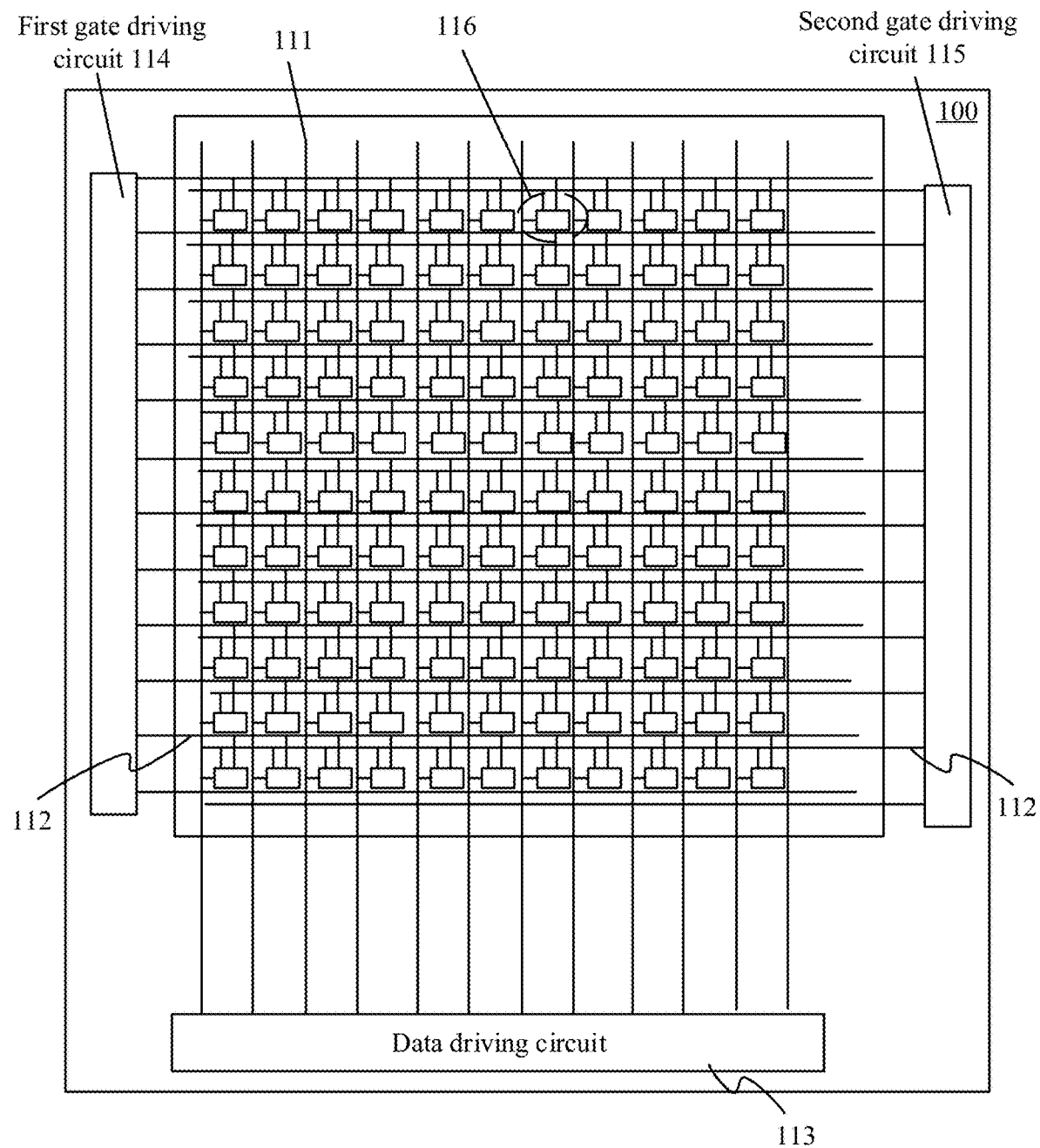
FIG. 2 is a schematic top view of a display panel according to another embodiment of the present disclosure.

In order to illustrate the structure of the display region of the display panel in more details, the display region of the display panel is further described in an embodiment of the present disclosure. Reference is made to FIG. 2, which is a schematic top view of the display panel. In the embodiment shown in FIG. 2, the display region of the display panel is provided with a pixel circuit. The pixel circuit includes multiple gate lines 112, multiple data lines 111, and multiple thin film transistors. The multiple gate lines 112 are arranged in a first direction and extended in a second direction above a surface of the substrate. The multiple data lines 111 are arranged in the second direction and extended in the first direction above the surface of the substrate. The multiple thin film transistors are arranged in regions defined by the gate lines 112 and the data lines 111. The first direction intersects with the second direction. A drain electrode of at least one thin film transistor in each defined region is electrically connected to an anode of a display pixel 116 in the display region.

Further, a data driving circuit 113, a first gate driving circuit 114 and a second gate driving circuit 115 are shown in FIG. 2. The pixel circuit receives a data signal from the data driving circuit 113 via the multiple data lines 111, and receives a scanning signal from the first gate driving circuit 114 and the second gate driving circuit 115 via the multiple gate lines 112. The display pixel 116 is arranged at an intersection between the data line 111 and the gate line 112 to emit light in response to the data signal and the scanning signal. The data driving circuit 113 shown in FIG. 2 is generally arranged in a chip that is bonded in the bonding region.

In this embodiment, still referring to FIG. 1, the power supply line region 123 includes a power supply line 300. The data lines 111 are arranged in the same layer as the power supply line 300.

Normally, multiple layers of metal are utilized in the manufacturing process of the display panel, generally including a first metal layer, a second metal layer, a third metal layer, and a fourth metal layer. The first metal layer is closest to the substrate, and the second metal layer, the third metal layer and the fourth metal layer are sequentially arranged on a side of the first metal layer away from the substrate. The data lines in the display region are usually formed in the third metal layer with a low resistance, so as to reduce resistances of the data lines. In this embodiment, the power supply line 300 is arranged in the same layer as the data lines, i.e., the third metal layer with a low resistance, so as to avoid that an excessive voltage drop is generated due to large resistances of the power supply line 300 during the process of the power supply line 300 transmitting an operation power to the pixel circuit.

Still referring to FIG. 1, the power supply line 300, the power supply fan-out line 500, and the data fan-out lines 200 in the step region are described below in detail.

The power supply line 300 includes a first power line 310 and a second power line 320.

The first power line 310 and the second power line 320 are arranged in parallel, and the second power line 320 is located on a side of the first power line 310 away from the display region 110.

The first power line 310 is electrically connected to the anode of the display pixel via a thin film transistor of the pixel circuit.

The second power line 320 is electrically connected to a cathode of the display pixel.

Figure 3:
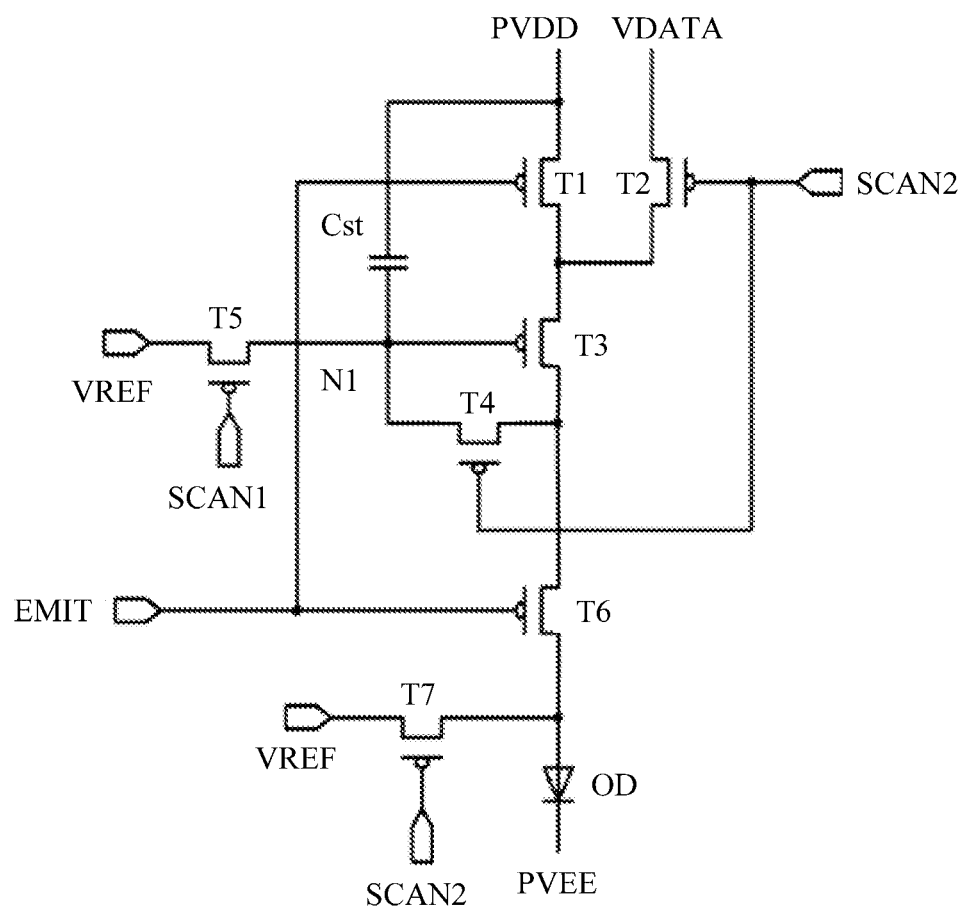
FIG. 3 is a schematic structural diagram of a pixel circuit according to an embodiment of the present disclosure.

Reference is made to FIG. 3, which is a schematic structural diagram of a pixel circuit.

In an initialization period, a light emission control line EMIT is inputted with a high level, a first scan line SCAN1 is inputted with a low level, and second scan lines SCAN2 are inputted with high levels. In this case, a fifth transistor T5 is turned on, and a voltage VREF is transmitted to a node N1 via the fifth transistor T5, so that both a potential of a gate of a third transistor T3 and a potential of one end of a storage capacitor Cst are equal to VREF, which is less than a voltage VDATA.

In a data writing period, the light emission control line EMIT is inputted with a high level, the first scan line SCAN1 is inputted with a high level, and the second scan lines SCAN2 are inputted with low levels. In this case, a second transistor T2, the third transistor T3, and a fourth transistor M4T4 are turned on, and VDATA is transmitted to the gate of the third transistor T3. When the gate potential of the T3 reaches a voltage VDATA−Vth, the T3 is turned off, and a threshold acquisition process is completed, where Vth indicates a threshold voltage of the T3.

In a light emission period, the light emission control line EMIT is inputted with a low level, and the first scan line SCAN1 and the second scan lines SCAN2 are inputted with high levels. In this case, the second transistor T1, the fourth transistor T4 and a seventh transistor T7 are turned off, and a first transistor T1 and a sixth transistor T6 are turned on to drive the third transistor T3 to be turned on. In this way, the current is supplied to a light emitting diode OD, i.e., a sub-pixel, to control the OD to emit light.

The first power line 310 transmits a PVDD signal, and the second power line 320 transmits a PVEE signal, and finally the pixel circuit supplies a current to control the OLED device to emit light.

In an embodiment, still referring to FIG. 1, the second power line 320 is divided into three second sub power lines that are parallel to the first power line 310, and there is a gap between adjacent second sub power lines.

The power supply fan-out line 500 includes one second power fan-out line 520 and two first power fan-out lines 510.

The second power fan-out line 520 is utilized to connect the second power line 320 and the bonding region 122.

The first power fan-out line 510 is connected to the bonding region 122 and the first power line 310 through the gap between the adjacent second sub power lines.

The two first power fan-out lines 510 are respectively arranged on two sides of the second power fan-out line 520.

Figure 4:
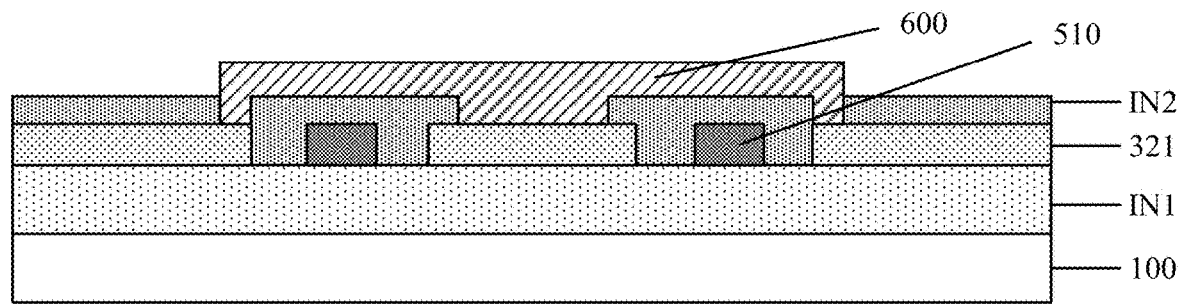
FIG. 4 is a schematic sectional view taken along a line AA' in FIG. 1.

Reference is made to FIG. 4, which is a schematic sectional view taken along a line AA' in FIG. 1. As shown in FIG. 4, the adjacent second sub power lines 321 are electrically connected to each other via a metal interconnection layer 600, and the second power line is electrically connected to the cathode of the display pixel via the metal interconnection layer 600.

The metal interconnection layer 600 is arranged in the same layer as the anode of the display pixel.

Further, a first insulating layer IN1 between the second sub power line 321 and the substrate 100, and a second insulating layer IN2 between the metal interconnection layer 600 and the second sub power line 321 are shown in the FIG. 4. The metal interconnection layer 600 is electrically connected to the second sub power line 321 through via holes in the second insulating layer IN2.

The anode of the display pixel is generally formed by patterning the fourth metal layer mentioned above. In this embodiment, the metal interconnection layer 600, via which the adjacent second sub power lines 321 are electrically connected to each other and the second power line is electrically connected to the cathode of the display pixel, is also formed in the fourth metal layer, so that the metal interconnection layer 600 and the anode of the display pixel are formed in a same patterning process, which simplifies the manufacturing process of the display panel.

Figure 5:
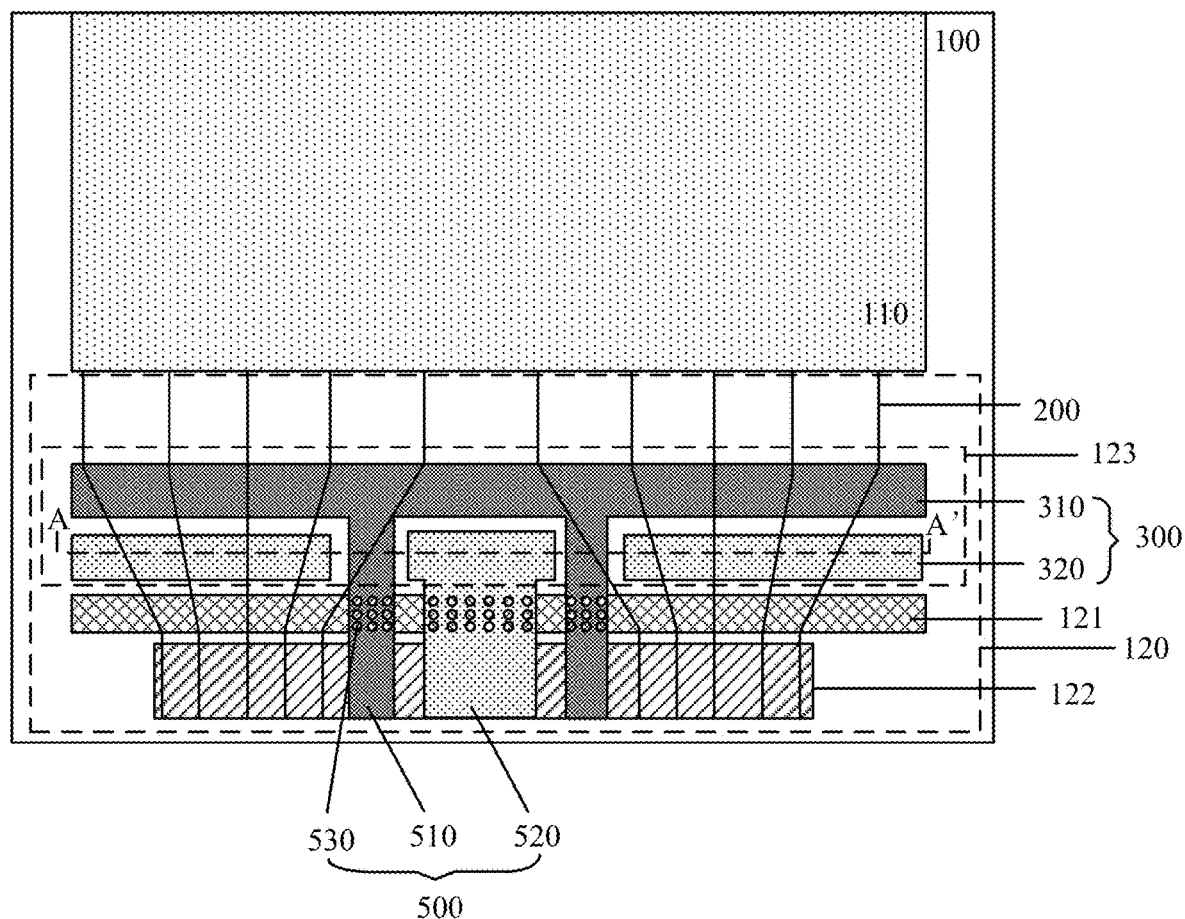
FIG. 5 is a schematic top view of a display panel according to another embodiment of the present disclosure.

Reference is made to FIG. 5, which is a schematic top view of the display panel. As shown in FIG. 5, in order to provide a stress releasing passage for the sealant in the encapsulating region during the encapsulating process, the power supply fan-out line 500 further includes multiple first through holes 530.

The multiple first through holes 530 are located in a region of each of the first power fan-out lines 510 overlapping with the encapsulating region 121 and a region of the second power fan-out line 520 overlapping with the encapsulating region 121.

The first through holes 530 allows the sealant to extend towards the holes when being burned by the laser, so as to release the stress, thereby avoiding the deformation of the sealant due to the stress, and thus avoiding the encapsulating failure.

In practical applications, with the increasing resolution of the display panel, the number of display pixels in the display region increases, the number of data lines for connecting the display pixels increases, and the number of data fan-out lines for leading out the data lines increases. In this case, a large number of data fan-out lines 200 are concentrated in a specific region of the bonding region 122, and a distance between adjacent data fan-out lines 200 is less than a distance between adjacent data lines. Reference is made to FIGS. 6a and 6b. FIG. 6a is a schematic diagram showing an arrangement of the data fan-out lines 200, and FIG. 6b is a schematic sectional view taken along a line BB' in FIG. 6a. In one embodiment, as shown in FIGS. 6a and 6b, the data fan-out lines 200 include multiple first data fan-out lines 201 and multiple second data fan-out lines 202.

The multiple first data fan-out lines 201 and the multiple second data fan-out lines 202 are alternately arranged.

The first data fan-out lines 201, the second data fan-out lines 202, and the power supply line 300 are arranged in different layers.

Further, an insulating layer IN3 between the first metal layer and the substrate 100, an insulating layer IN4 between the first metal layer and the second metal layer, and an insulating layer IN5 between the second metal layer and the third metal layer are shown in FIG. 6(b). The three insulating layers form the first insulating layer IN1.

In FIGS. 6a and 6b, the first data fan-out lines 201 and the second data fan-out lines 202 are located in different layers. Assuming that a transverse distance and a longitudinal distance between the first data fan-out line 201 and the second data fan-out line 202 that are adjacent to each other are respectively indicated by a and b, a distance between the adjacent lines may be expressed as $\sqrt{a^2+b^2}$. In a case that the first data fan-out line 201 and the second data fan-out line 202 are located in the same layer, if it is required that the distance between the adjacent lines is equal to $\sqrt{a^2+b^2}$, the transverse distance should be set to $\sqrt{a^2+b^2}$. The distance between the first data fan-out line 201 and the second data fan-out line 202 that are adjacent to each other is inversely proportional to a coupling capacitance between the adjacent lines. Under the condition of having the same distance between the adjacent first and second fan-out lines, the transverse distance between the adjacent first and second fan-out lines located in different layers is less than the transverse distance between the adjacent first and second fan-out lines located in a same layer. That is, the first data fan-out lines 201 and the second data fan-out lines 202 are arranged more densely.

Similarly, the power supply line 300, the first data fan-out lines 201, and the second data fan-out lines 202 are arranged in different layers, to form signal shielding using insulating layers between the different layers, so as to reduce the effect of the power supply line on a signal on the data fan-out line 200. Since the power supply line is generally formed in the third metal layer as described above, the first data fan-out line 201 and the second data fan-out line 202 may be respectively formed in the first metal layer and the second metal layer.

Optionally, the first data fan-out lines 201 are arranged above the surface of the substrate and formed in the first metal layer.

The second data fan-out lines 202 are arranged on a side of the first data fan-out line 201 away from the substrate and formed in the second metal layer.

The power supply line 300 is arranged on a side of the second data fan-out lines 202 away from the first data fan-out lines 201 and is formed in the third metal layer.

For a bottom-gate thin film transistor (TFT), a buffer layer is generally arranged between the first data fan-out lines 201 and the substrate. The first data fan-out lines 201 are arranged in the same layer as the gate and the gate line on the buffer layer.

For a top-gate TFT, a buffer layer, a source/drain electrode, and a gate insulating layer are generally arranged sequentially in a space from the substrate to the first data fan-out lines 201. The first data fan-out line 201 is arranged in a same layer as the gate and the gate line on a surface of the gate insulating layer.

Therefore, the first data fan-out lines 201 being located above the surface of the substrate does not indicate that the first data fan-out lines 201 are in close contact with the substrate. Different film layers may be arranged between the first data fan-out lines 201 and the substrate depending on different TFTs.

The first data fan-out lines 201 and the second data fan-out lines 202 may be electrically connected to the data lines in the display region through via holes in insulating layers between different metal layers. The specific flow of forming the via holes in the insulating layers are not described in detail herein.

Figure 7:
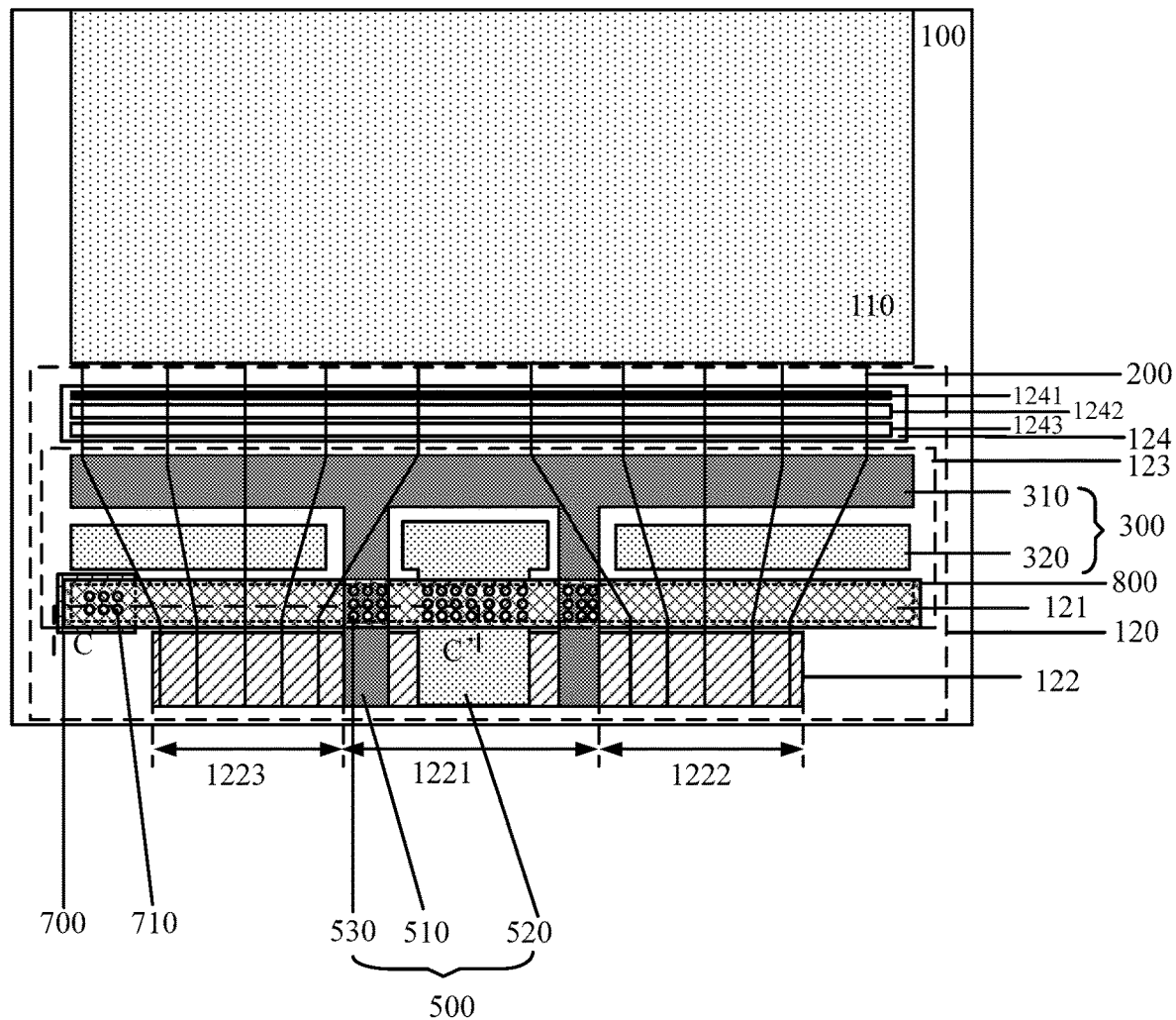
FIG. 7 is a schematic top view of a display panel according to another embodiment of the present disclosure.

Based on the above embodiments, in another embodiment of the present disclosure, as shown in FIG. 7, which is a schematic top view of the display panel, the display panel further includes a circuit region 124 arranged between the display region 110 and the power supply line region 123.

The circuit region 124 is generally provided with a shorting bar 1241 that is electrically connected to all the data lines. The shorting bar 1241 is utilized to connect the data lines together in an operation state, to provide a same data signal for all the display pixels. The shorting bar 1241 is generally utilized in the test process of the display panel, to control all the pixels in the display panel to display a same color, so as to detect abnormal pixel points or other display abnormalities in the display panel.

In addition, the circuit region 124 may be further provided with other functional circuits, such as a demultiplexer 1242 and an electro-static discharge (ESD) circuit 1243. The demultiplexer 1242 may demultiplex a data signal transmitted on one data fan-out line and transmit the demultiplexed data signal to multiple data lines, to reduce the number of data fan-out lines, thereby reducing the probability of generating capacitive coupling between the data fan-out lines. Further, the display panel can have a "narrow step" in a case of a small number of data fan-out lines. The electro-static discharge circuit 1243 is mainly utilized to discharge static electricity that may be generated in the display panel, to protect components in the display panel from being damaged by the static electricity.

Still referring to FIG. 7, the bonding region 122 includes a first bonding region 1221, a second bonding region 1222, and a third bonding region 1223. The second bonding region 1222 and the third bonding region 1223 are respectively arranged on two sides of the first bonding region 1221.

The power supply fan-out line 500 is connected to the first bonding region 1221.

The data fan-out lines 200) are connected to the second bonding region 1222 and the third bonding region 1223.

Since the first bonding region 1221 for connecting the power supply fan-out line 500 is arranged between the second bonding region 1222 and the third bonding region 1223 for connecting the data fan-out lines 200, the power supply fan-out line 500 and the data fan-out lines 200 do not have a common overlapping region with the encapsulating region 121, so that an orthographic projection of an overlapping region between the power supply fan-out line 500 and the encapsulating region 121 on the substrate 100 is non-overlapping with an orthographic projection of an overlapping region between each of the data fan-out lines 200 and the encapsulating region 121 on the substrate 100, thereby reducing the encapsulating failure of the sealant due to a common overlapping region of the data fan-out line 200 and the power supply fan-out line 500 with the encapsulating region, and improving the reliability of the display panel.

In addition, with the design that the first bonding region 1221 is arranged between the second bonding region 1222 and the third bonding region 1223, the length and the inclination of the data fan-out line 200 can be reduced, thereby reducing the resistance of the data fan-out line 200, and reducing a resistance difference between the data fan-out line 200 located at the edge and the data fan-out line 200 located at the center. Therefore, the display uniformity of the display panel is improved.

Further, with the design that the first bonding region 1221 is arranged between the second bonding region 1222 and the third bonding region 1223, an area of the step region 120 can be reduced, and thus the display panel can have a "narrow step". This is because the second bonding region 1222 and the third bonding region 1223 are located on two sides of the first bonding region 1221, which is beneficial to reducing the length of the data fan-out line 200, reducing a length of the data fan-out line 200 in a length direction of the display panel, and thus reducing an area of the step region 120 occupied by the data fan-out lines 200.

Figure 8:
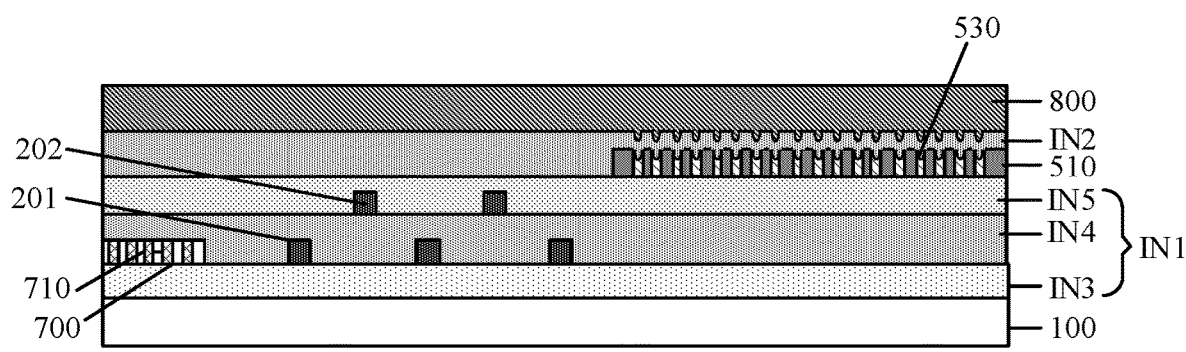
FIG. 8 is a schematic sectional view taken along a line CC' in FIG. 7.

Based on the above embodiments, in one embodiment of the present disclosure, as shown in FIG. 8, which is a schematic sectional view taken along a line CC' in FIG. 7, the display panel further includes a metal gasket layer 700 and a sealant 800.

Multiple second holes 710 are formed in the metal gasket layer 700. An orthographic projection of the metal gasket layer 700 on the substrate 100 is non-overlapping with orthographic projections of the power supply fan-out line and the data fan-out lines on the substrate.

The sealant 800 is arranged on a side of the metal gasket layer 700 away from the substrate, and a projection of the sealant 800 on the substrate 100 covers a projection of the encapsulating region on the substrate 100. The multiple second holes 710 are located in a region of the metal gasket layer 700 overlapping with the sealant 800.

The sealant 800 is a layer of frit.

Since the metal gasket layer 700, and the data fan-out lines and the power supply fan-out line in the encapsulating region are required to reflect laser in a subsequent laser encapsulating process, a rough rectangular region covering the encapsulating region is formed by the metal gasket layer 700, and the data fan-out lines and the power supply fan-out line in the encapsulating region. In practical applications, a projection of the metal gasket layer 700 in the formed region is non-overlapping with projections of the data fan-out line and the power fan-out line in the formed region, and the metal gasket layer 700 may be grounded.

In the subsequent laser encapsulating process, the sealant is fused after being scanned by the laser to have adhesiveness, so as to bond the array substrate with the cover of the display panel. The frit has a low fusion point and good water-proof and oxygen-proof properties.

Figure 9:
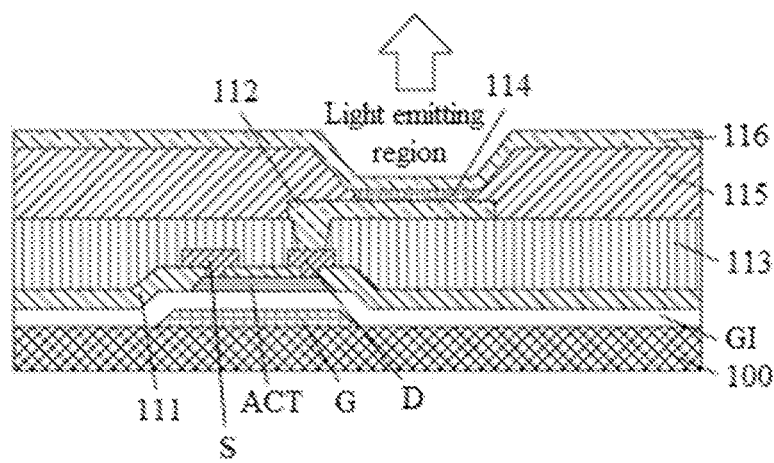
FIG. 9 is a schematic sectional view of a display pixel according to an embodiment of the present disclosure.

Based on the above embodiments, a specific structure of the display pixel is described in another embodiment of the present disclosure. As shown in FIG. 9, the display pixel includes: a planarization layer 113, an anode layer, a pixel defining layer 115, a light emitting material layer 114, and a cathode layer 116.

The planarization layer 113 is arranged above the surface of the substrate 100.

The anode layer is arranged on a side of the planarization layer 113 away from the substrate, and includes multiple anodes 112 arrayed in an array.

The pixel defining layer 115 is arranged on a side of the anode layer away from the substrate, and has multiple pixel grooves.

The light emitting material layer 114 is arranged on a side of the anode layer away from the substrate 100, and includes multiple light emitting structures in one-to-one correspondence with the multiple anodes 112.

The cathode layer 116 is arranged on a side of the light emitting material layer away from the substrate. The cathode layer 116, the multiple anodes 112, and the multiple light emitting structures 114 form multiple first display sub-pixels, multiple second display sub-pixels and multiple third display sub-pixels.

In the embodiment shown in FIG. 9, the light emitting material layer includes three types of light emitting structures, i.e., red light emitting structures, green light emitting structures, and blue light emitting structures. Correspondingly, the first display sub-pixel, the second display sub-pixel and the third display sub-pixel are respectively a red sub-pixel, a green sub-pixel and a blue sub-pixel. The cathode layer arranged on the side of the light emitting material layer away from the substrate is generally in an integrated structure, which may serve as a common cathode for all the display pixels, so as to simplify the manufacturing process of the display panel.

In addition, FIG. 9 further shows a structure of a bottom-gate TFT, which includes a source S, a drain D, an active layer ACT, a gate G, and a gate insulating layer GI located on a side of the gate G away from the substrate 100. An etch barrier 111 and a through hole in the planarization layer 113 are further shown in FIG. 9. The anode 112 is connected to the drain D of the TFT via the through hole.

In a typical case, the light emitting structure includes a buffer layer, a first common layer, a light emitting layer, and a second common layer that are sequentially stacked in the pixel defining layer 115.

The first common layer includes: a hole injection layer (HIL) arranged on a surface of the buffer layer, and a hole transport layer (HTL) arranged on a side of the hole injection layer away from the buffer layer.

The second common layer includes: an electron transport layer (ETL) arranged on a surface of the light emitting layer, and an electron injection layer (EIL) on a side of the electron transport layer away from the light emitting layer.

The light emitting layer varies depending on the light emitting type of the display pixel. The hole injection layer is utilized to improve energy level matching between the anode 112 and the hole transport layer. The anode 112 is generally manufactured by using an indium tin oxide (ITO) layer. However, the commonly used material for the hole transport layer does not match with the energy level of the ITO layer, which results in a low hole transport efficiency. Therefore, it is required to provide a hole injection layer, to reduce an injection barrier between the anode 112 and the hole transport layer, thereby assisting injection of holes from the ITO layer into the hole transport layer. Similarly, the electron injection layer is utilized to improve energy level matching between the cathode layer and the electron transport layer. In other embodiments of the present disclosure, in a case that the injection barrier between the anode 112 and the hole transport layer is small, the first common layer may include only the hole transport layer. Similarly, in a case that the injection barrier between the cathode layer and the electron transport layer is small, the second common layer may only include the electron transport layer. The specific configurations of the first common layer and the second common layer are not limited in the present disclosure, which depend on the practical situations.

Figure 10:
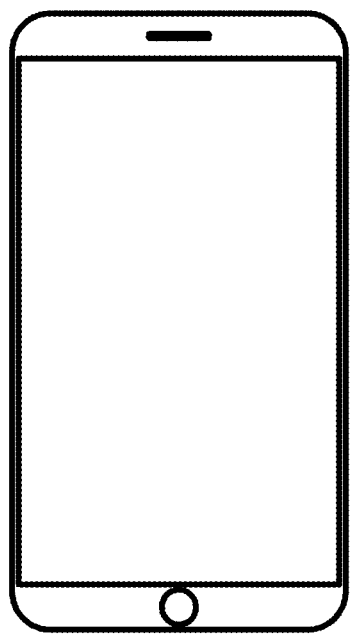
FIG. 10 is a schematic diagram showing an appearance of an electronic device according to an embodiment of the present disclosure.

Correspondingly, an electronic device is further provided according to an embodiment of the present disclosure. As shown in FIG. 10 which is a schematic diagram showing an appearance of the electronic device, the electronic device includes at least one display panel according to any one of the above embodiments.

Figure 11:
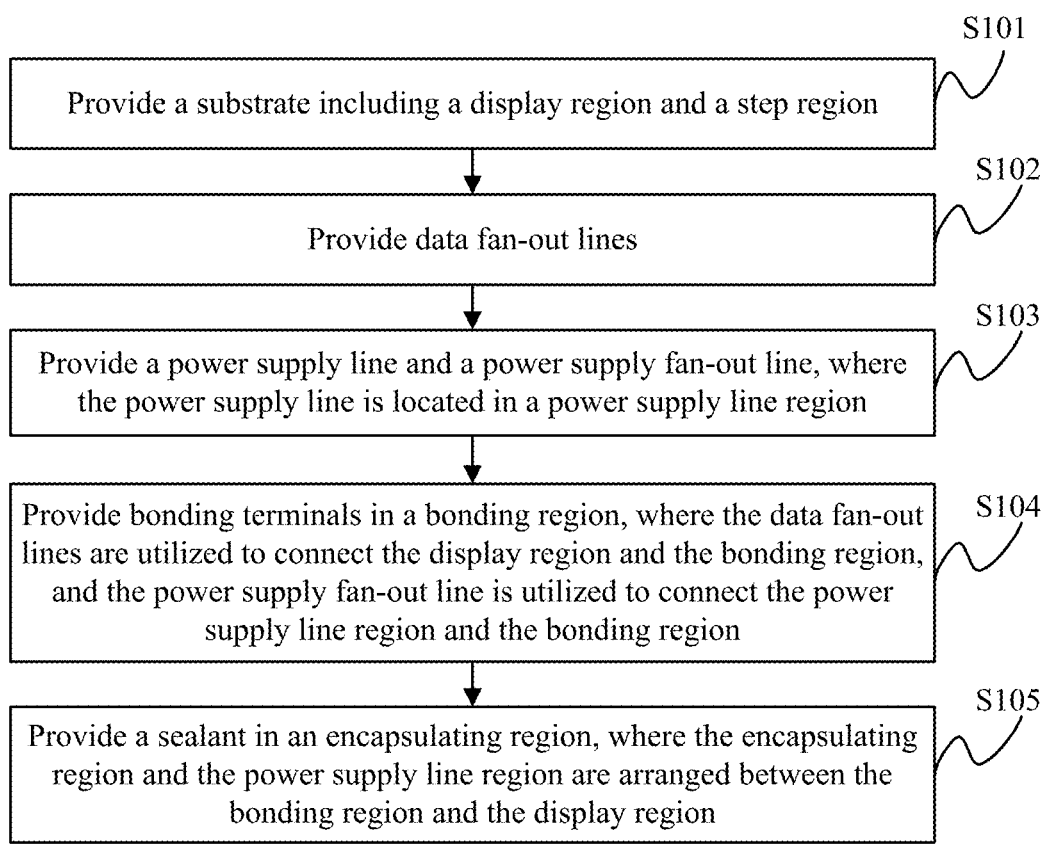
FIG. 11 is a schematic flowchart of a method for manufacturing a display panel according to an embodiment of the present disclosure.

Correspondingly, a method for manufacturing a display panel is further provided according to an embodiment of the present disclosure. As shown in FIG. 11, which is a schematic flowchart of the method for manufacturing a display panel, the method includes the following steps S101 to S105.

Figure 12:
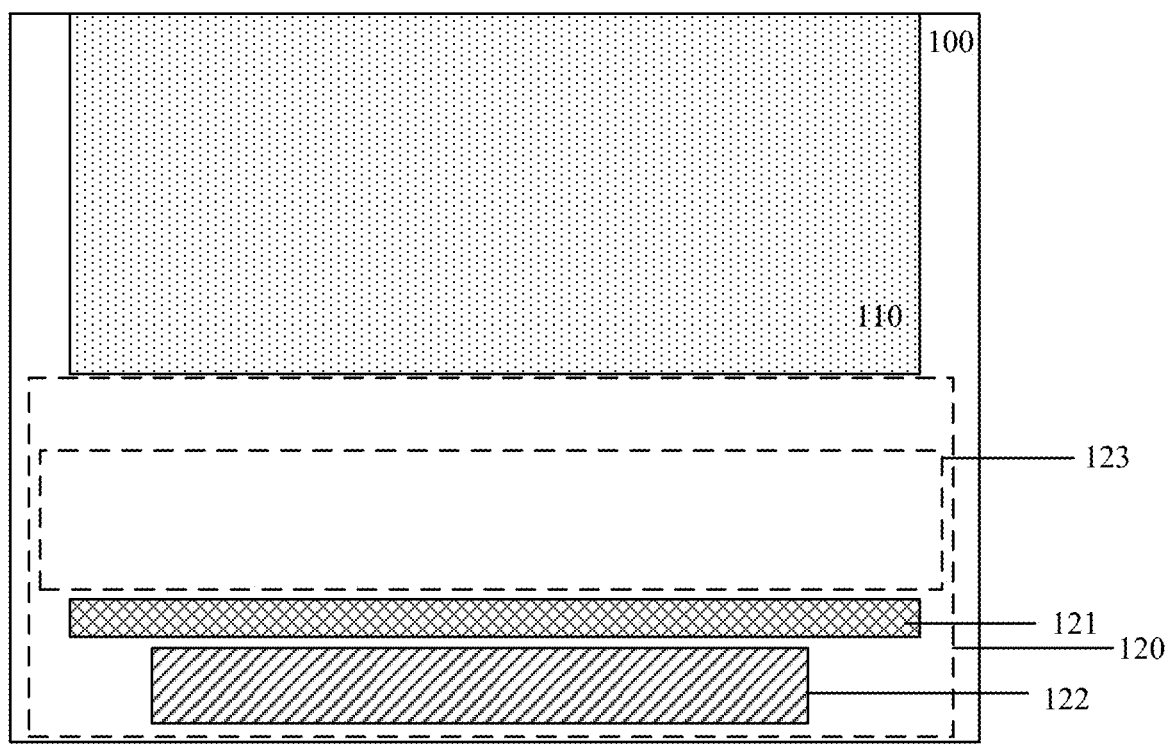
FIGS. 12 to 13 are diagrams showing a manufacturing flow of a display panel according to an embodiment of the present disclosure.

In S101, a substrate is provided. The substrate includes a display region and a step region. Reference is made to FIG. 12, which is a schematic top view of the substrate. In FIG. 12, a reference numeral 100 denotes the substrate, a reference numeral 110 denotes the display region, a reference numeral 120 denotes the step region, a reference numeral 121 denotes an encapsulating region located in the step region, a reference numeral 122 denotes a bonding region located in the step region, and a reference numeral 123 denotes a power supply line region located in the step region.

The following steps S102 to S105 are performed in the step region.

Figure 13:
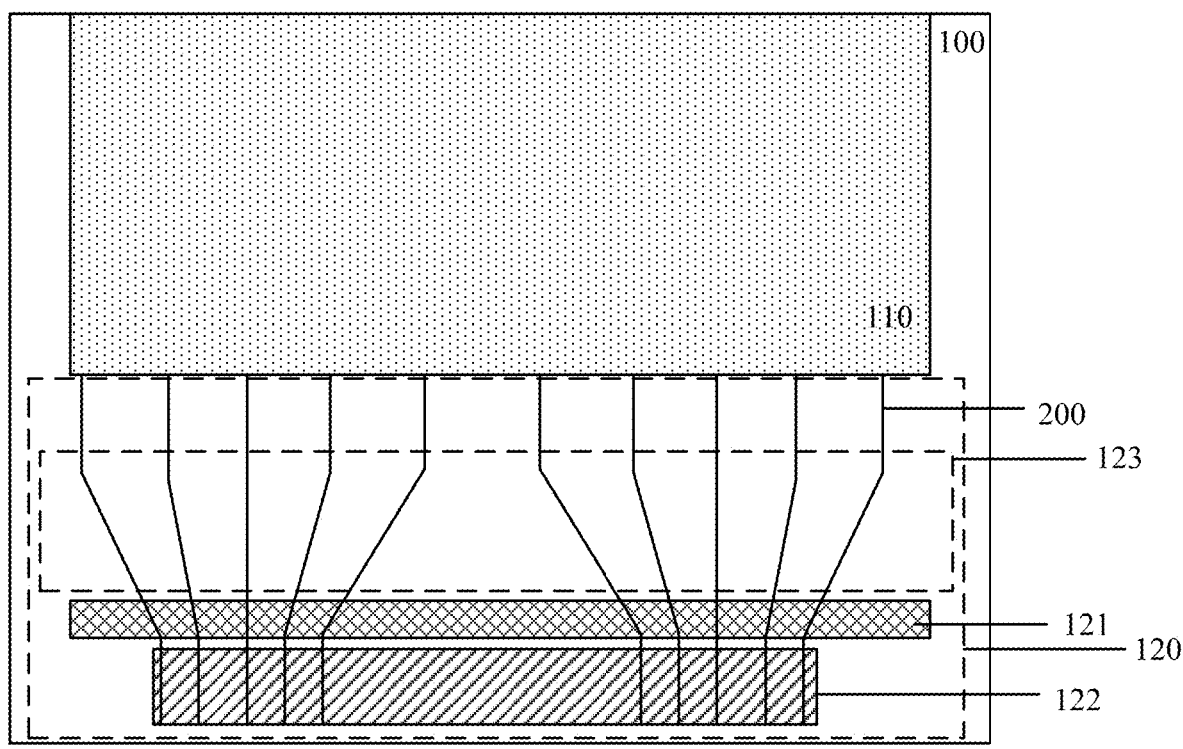

In S102, data fan-out lines are provided. Reference is made to FIG. 13, which is a schematic top view showing the substrate and a surface structure thereof after step S102. In FIG. 13, a reference numeral 200 denotes the data fan-out line.

In S103, a power supply line and a power supply fan-out line are provided. The power supply line is located in the power supply line region. Reference is made to FIG. 1, which is a schematic top view showing the substrate and the surface structure thereof after step S103. In FIG. 1, a reference numeral 500 denotes the power supply fan-out line, and a reference numeral 300 denotes the power supply line. In addition, FIG. 1 further shows a first power fan-out line 510 and a second power fan-out line 520 included in the power supply fan-out line, and a first power line 310 and a second power line 320 included in the power supply line.

In S104, bonding terminals (which are not shown in the drawings) are provided in the bonding region. The data fan-out lines are utilized to connect the display region and the bonding region, and the power supply fan-out line is utilized to connect the power supply line region and the bonding region.

In S105, a sealant (which is not shown in the drawings) is provided in the encapsulating region. The encapsulating region and the power supply line region are arranged between the bonding region and the display region.

An orthographic projection of an overlapping region between the power supply fan-out line and the encapsulating region on the substrate is non-overlapping with an orthographic projection of an overlapping region between each of the data fan-out lines and the encapsulating region on the substrate.

It should be noted that steps S102 to S105 are all performed in the step region of the substrate, that is, the step region includes the bonding region, and the encapsulating region and the power supply line region that are sequentially arranged between the bonding region and the display region.

Figure 14:
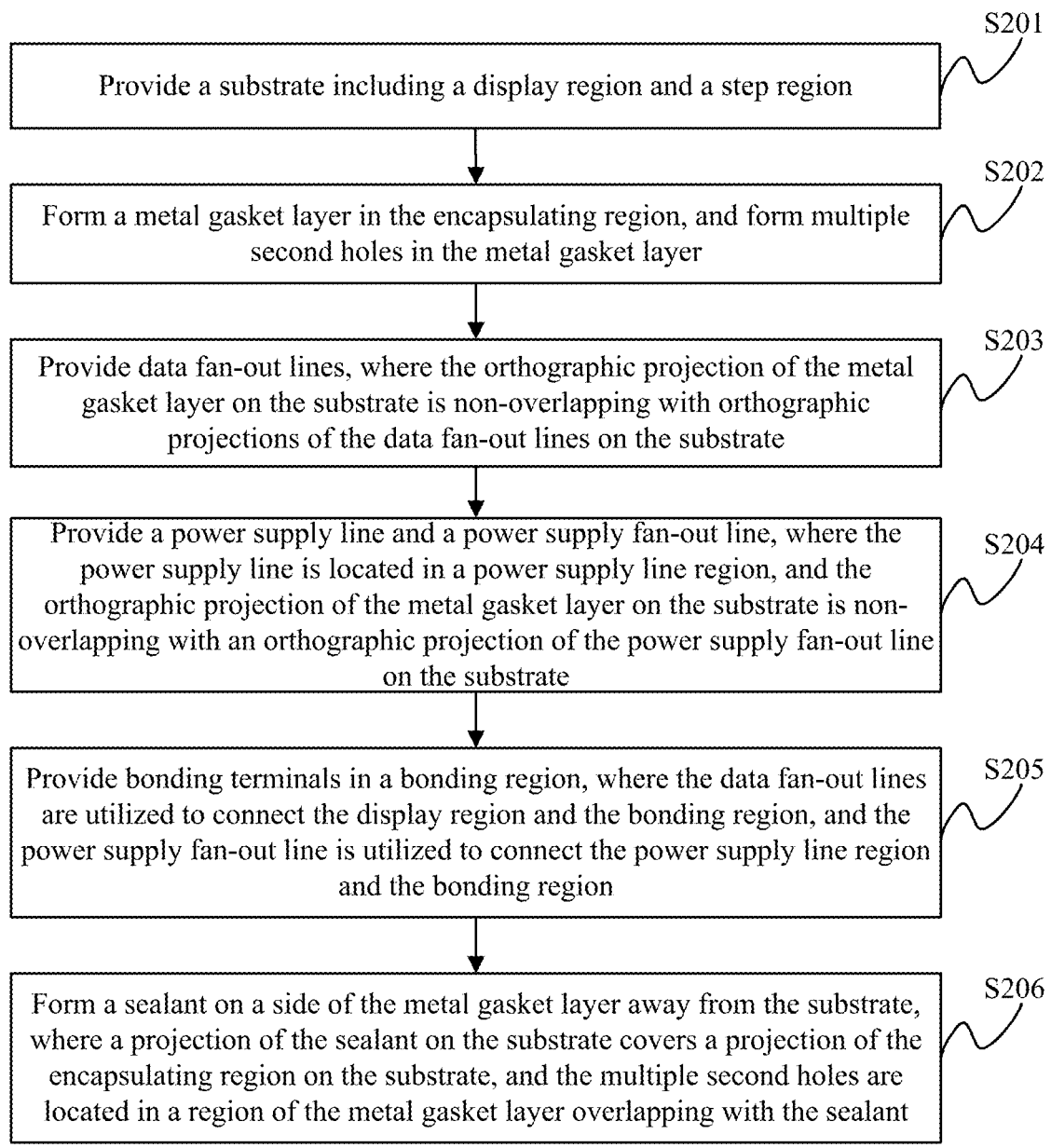
FIG. 14 is a schematic flowchart of a method for manufacturing a display panel according to another embodiment of the present disclosure.

Based on the above embodiments, in an embodiment of the present disclosure, as shown in FIG. 14, which is a schematic flowchart of the method for manufacturing a display panel, the method for manufacturing a display panel includes the following steps S201 to S206.

In S201, a substrate is provided. The substrate includes a display region and a step region In S202, a metal gasket layer is formed in the encapsulating region, and multiple second holes are formed in the metal gasket layer.

In S203, data fan-out lines are provided. The orthographic projection of the metal gasket layer on the substrate is non-overlapping with orthographic projections of the data fan-out lines on the substrate.

In S204, a power supply line and a power supply fan-out line are provided. The power supply line is located in the power supply line region. The orthographic projection of the metal gasket layer on the substrate is non-overlapping with an orthographic projection of the power supply fan-out line on the substrate.

In S205, bonding terminals are provided in the bonding region. The data fan-out lines are utilized to connect the display region and the bonding region, and the power supply fan-out line is utilized to connect the power supply line region and the bonding region.

In S206, a sealant is formed on a side of the metal gasket layer away from the substrate. A projection of the sealant on the substrate covers a projection of the encapsulating region on the substrate. The multiple second holes are located in a region of the metal gasket layer overlapping with the sealant.

It should be noted that the method according to the embodiment of the present disclosure include the above steps, but the order of the steps is not limited. Those skilled in the art may understand, for example, that the metal gasket layer and a part of the data fan-out lines are located in the first metal layer, and thus may be formed in a same process.

The sealant is a layer of frit.

Since the metal gasket layer, and the data fan-out lines and the power supply fan-out line in the encapsulating region are required to reflect laser in a subsequent laser encapsulating process, a complete rectangular region covering the encapsulating region is formed by the metal gasket layer, and the data fan-out lines and the power supply fan-out line in the encapsulating region. In practical applications, the metal gasket layer generally is grounded.

In the subsequent laser encapsulating process, the sealant is fused after being scanned by the laser to have adhesiveness, so as to bond the array substrate with the cover of the display panel. The frit has a low fusion point and good water-proof and oxygen-proof properties.

Based on the above embodiments, one embodiment of the present disclosure, as shown in FIG. 7, the bonding region 122 includes a first bonding region 1221, a second bonding region 1222, and a third bonding region 1223. The second bonding region 1222 and the third bonding region 1223 are respectively arranged on two sides of the first bonding region 1221.

The power supply fan-out line 500 is connected to the first bonding region 1221.

The data fan-out lines 200 are connected to the second bonding region 1222 and the third bonding region 1223.

Since the first bonding region 1221 for connecting the power supply fan-out line 500 is arranged between the second bonding region 1222 and the third bonding region 1223 for connecting the data fan-out lines 200, the power supply fan-out line 500 and the data fan-out lines 200 do not have a common overlapping region with the encapsulating region 121, so that an orthographic projection of an overlapping region between the power supply fan-out line and the encapsulating region on the substrate is non-overlapping with an orthographic projection of an overlapping region between each of the data fan-out lines and the encapsulating region on the substrate, thereby reducing the encapsulating failure of the sealant due to a common overlapping region of the data fan-out line and the power fan-out line with the encapsulating region, and improving the reliability of the display panel.

In conclusion, there are provided an electronic device, a display panel, and a method for manufacturing a display panel according to the embodiments of the present disclosure. The display panel includes a substrate, and data fan-out lines and a power supply fan-out line arranged in a step region of the substrate. An orthographic projection of an overlapping region between the power supply fan-out line and the encapsulating region on the substrate is non-overlapping with an orthographic projection of an overlapping region between each of the data fan-out lines and the encapsulating region on the substrate, thereby reducing the encapsulating failure of the sealant due to a common overlapping region of the data fan-out line and the power supply fan-out line with the encapsulating region, and improving the reliability of the display panel.

In addition, with the design that the first bonding region is arranged between the second bonding region and the third bonding region, the length and the inclination of the data fan-out line can be reduced, thereby reducing the resistance of the data fan-out line, and reducing a resistance difference between the data fan-out line located at the edge and the data fan-out line located at the center. Therefore, the display uniformity of the display panel is improved.

Further, with the design that the first bonding region is arranged between the second bonding region and the third bonding region, an area of the step region can be reduced, and thus the display panel can have a "narrow step". This is because the second bonding region and the third bonding region are located on two sides of the first bonding region, which is beneficial to reducing the length of the data fan-out line, reducing a length of the data fan-out line in a length direction of the display panel, and thus reducing an area of the step region occupied by the data fan-out line.

Embodiments in this specification are described in a progressive manner, each of the embodiments emphasizes differences from other embodiments, and the same or similar parts among the embodiments can be referred to each other.

The invention claimed is:

1. A display panel, comprising:
   a substrate comprising a display region and a step region, wherein the step region comprises:
     a bonding region;
     an encapsulating region and a power supply line region that are sequentially arranged between the bonding region and the display region, and a power supply line is provided in the power supply line region, wherein the power supply line comprises a first power line and a second power line that are arranged in parallel, the second power line is arranged on a side of the first power line away from the display region, and the second power line is divided into three second sub power lines that are parallel to the first power line, with a gap being between adjacent second sub power lines among the three second sub power lines;

data fan-out lines connecting the display region and the bonding region; and a power supply fan-out line connecting the power supply line region and the bonding region, the power supply fan-out line comprises one second power fan-out line and two first power fan-out lines, the second power fan-out line connects the second power line and the bonding region, the first power fan-out line connects the first power line and the bonding region and the first power fan-out line extends through the gap between the adjacent second sub power lines, and the two first power fan-out lines are respectively arranged on two sides of the second power fan-out line; wherein an orthographic projection of an overlapping region between the power supply fan-out line and the encapsulating region on the substrate is non-overlapping with an orthographic projection of an overlapping region between each of the data fan-out lines and the encapsulating region on the substrate.

2. The display panel according to claim 1, further comprising:

a circuit region arranged between the display region and the power supply line region.

3. The display panel according to claim 2, further comprising:

a shorting bar provided in the circuit region and electrically connected to all data lines in the display region.

4. The display panel according to claim 2, further comprising:

one or more of a demultiplexer and an electro-static discharge circuit provided in the circuit region.

5. The display panel according to claim 1, wherein the first power line is electrically connected to an anode of a display pixel via a thin film transistor; and the second power line is electrically connected to a cathode of the display pixel.

6. The display panel according to claim 1, wherein the adjacent second sub power lines are electrically connected via a metal interconnection layer, and the second power line is electrically connected to a cathode of a display pixel via the metal interconnection layer; and the metal interconnection layer and the an anode of the display pixel are arranged in a same layer.

7. The display panel according to claim 1, wherein the power supply fan-out line comprises a plurality of first through holes; and the plurality of first through holes are located in a region of each of the first power fan-out lines overlapping with the encapsulating region and a region of the second power fan-out line overlapping with the encapsulating region.

8. The display panel according to claim 1, further comprising:

a plurality of gate lines arranged in a first direction and extended in a second direction above a surface of the substrate;

a plurality of data lines arranged in the second direction and extended in the first direction above the surface of the substrate; and a plurality of thin film transistors arranged in regions defined by the gate lines and the data lines, wherein the first direction intersects with the second direction, a drain electrode of at least one thin film transistor in each defined region is electrically connected to an anode of a display pixel in the display region, and the data line and the power supply line are arranged in a same layer.

9. The display panel according to claim 8, wherein the data fan-out lines comprise a plurality of first data fan-out lines and a plurality of second data fan-out lines that are alternately arranged; and the first data fan-out lines, the second data fan-out lines, and the power supply line are arranged in different layers.

10. The display panel according to claim 9, wherein the first data fan-out lines are arranged on the surface of the substrate;

the second data fan-out lines are arranged on a side of the first data fan-out lines away from the substrate; and the power supply line is arranged on a side of the second data fan-out lines away from the first data fan-out lines.

11. The display panel according to claim 1, wherein the bonding region comprises a first bonding region, a second bonding region and a third bonding region, wherein the second bonding region and the third bonding region are respectively arranged on two sides of the first bonding region;

the power supply fan-out line is connected to the first bonding region; and the data fan-out lines are connected to the second bonding region and the third bonding region.

12. The display panel according to claim 1, further comprising:

a metal gasket layer, wherein a plurality of second holes are formed in the metal gasket layer, and an orthographic projection of the metal gasket layer on the substrate is non-overlapping with orthographic projections of the power supply fan-out line and the data fan-out lines on the substrate; and a sealant arranged on a side of the metal gasket layer away from the substrate, wherein a projection of the sealant on the substrate covers a projection of the encapsulating region on the substrate, the plurality of second holes are located in a region of the metal gasket layer overlapping with the sealant; and the sealant is a layer of frit.

13. The display panel according to claim 1, further comprising:

a planarization layer arranged above a surface of the substrate;

an anode layer arranged on a side of the planarization layer away from the substrate, wherein the anode layer comprises a plurality of anodes arranged in an array;

a pixel defining layer arranged on a side of the anode layer away from the substrate, wherein the pixel defining layer has a plurality of pixel grooves;

a light emitting material layer arranged on a side of the anode layer away from the substrate, wherein the light emitting material layer comprises a plurality of light emitting structures in one-to-one correspondence with the plurality of anodes; and a cathode layer arranged on a side of the light emitting material layer away from the substrate, wherein the cathode layer, the plurality of anodes, and the plurality of light emitting structures form a plurality of first display sub-pixels, a plurality of second display sub-pixels and a plurality of third display sub-pixels.

14. An electronic device, comprising a display panel, wherein the display panel comprises a substrate comprising a display region and a step region; and the step region comprises:

a bonding region;

an encapsulating region and a power supply line region that are sequentially arranged between the bonding region and the display region, and a power supply line is provided in the power supply line region, wherein the power supply line comprises a first power line and a second power line that are arranged in parallel, the second power line is arranged on a side of the first power line away from the display region, and the second power line is divided into three second sub power lines that are parallel to the first power line, with a gap being between adjacent second sub power lines among the three second sub power lines;

data fan-out lines connecting the display region and the bonding region; and a power supply fan-out line connecting the power supply line region and the bonding region, the power supply fan-out line comprises one second power fan-out line and two first power fan-out lines, the second power fan-out line connects the second power line and the bonding region, the first power fan-out line connects the first power line and the bonding region and the first power fan-out line extends through the gap between the adjacent second sub power lines, and the two first power fan-out lines are respectively arranged on two sides of the second power fan-out line; wherein an orthographic projection of an overlapping region between the power supply fan-out line and the encapsulating region on the substrate is non-overlapping with an orthographic projection of an overlapping region between each of the data fan-out lines and the encapsulating region on the substrate.

15. The electronic device according to claim 14, wherein:

the bonding region comprises a first bonding region, a second bonding region and a third bonding region, wherein the second bonding region and the third bonding region are respectively arranged on two sides of the first bonding region;

the power supply fan-out line is connected to the first bonding region; and the data fan-out lines are connected to the second bonding region and the third bonding region.

16. The electronic device according to claim 14, wherein the display panel further comprises:

a metal gasket layer, wherein a plurality of second holes are formed in the metal gasket layer, and an orthographic projection of the metal gasket layer on the substrate is non-overlapping with orthographic projections of the power supply fan-out line and the data fan-out lines on the substrate; and a sealant arranged on a side of the metal gasket layer away from the substrate, wherein a projection of the sealant on the substrate covers a projection of the encapsulating region on the substrate, the plurality of second holes are located in a region of the metal gasket layer overlapping with the sealant; and the sealant is a layer of frit.

17. A method for manufacturing a display panel, comprising:

providing a substrate comprising a display region and a step region;

in the step region, providing a bonding region;

providing data fan-out lines;

providing a power supply line and a power supply fan-out line, wherein the power supply line is located in a power supply line region and comprises a first power line and a second power line that are arranged in parallel, the second power line is arranged on a side of the first power line away from the display region and is divided into three second sub power lines that are parallel to the first power line, with a gap being between adjacent second sub power lines among the three second sub power lines, the power supply fan-out line comprises one second power fan-out line and two first power fan-out lines, the second power fan-out line connects the second power line and the bonding region, the first power fan-out line connects the first power line and the bonding region and the first power fan-out line extends through the gap between the adjacent second sub power lines, and the two first power fan-out lines are respectively arranged on two sides of the second power fan-out line;

providing bonding terminals in the bonding region, wherein the data fan-out lines connect the display region and the bonding region, and providing a sealant in an encapsulating region, wherein the encapsulating region and the power supply line region are arranged between the bonding region and the display region, wherein an orthographic projection of an overlapping region between the power supply fan-out line and the encapsulating region on the substrate is non-overlapping with an orthographic projection of an overlapping region between each of the data fan-out lines and the encapsulating region on the substrate.

18. The method according to claim 17, wherein after providing the substrate, the method further comprises:

forming a metal gasket layer in the encapsulating region, and forming a plurality of second holes in the metal gasket layer, wherein an orthographic projection of the metal gasket layer on the substrate is non-overlapping with orthographic projections of the power supply fan-out line and the data fan-out lines on the substrate; and forming a sealant on a side of the metal gasket layer away from the substrate, wherein a projection of the sealant on the substrate covers a projection of the encapsulating region on the substrate;

the plurality of second holes are located in a region of the metal gasket layer overlapping with the sealant; and the sealant is a layer of frit.

19. The method according to claim 18, wherein the bonding region comprises a first bonding region, a second bonding region and a third bonding region, wherein the second bonding region and the third bonding region are respectively arranged on two sides of the first bonding region;

the power supply fan-out line is connected to the first bonding region; and the data fan-out lines are connected to the second bonding region and the third bonding region.

* * * * *